(12) United States Patent
Sano

(10) Patent No.: US 12,211,797 B2
(45) Date of Patent: Jan. 28, 2025

(54) FLEXIBLE SUBSTRATE

(71) Applicant: Japan Display Inc., Tokyo (JP)

(72) Inventor: Takumi Sano, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 255 days.

(21) Appl. No.: 17/870,837

(22) Filed: Jul. 22, 2022

(65) Prior Publication Data

US 2022/0359404 A1     Nov. 10, 2022

Related U.S. Application Data

(63) Continuation of application No. PCT/JP2020/040957, filed on Oct. 30, 2020.

(30) Foreign Application Priority Data

Jan. 22, 2020    (JP) ................................ 2020-008179

(51) Int. Cl.
    *H01L 23/538*     (2006.01)
    *H01L 23/528*     (2006.01)
    *H05K 1/02*     (2006.01)

(52) U.S. Cl.
    CPC ........ *H01L 23/5386* (2013.01); *H01L 23/528* (2013.01); *H01L 23/5387* (2013.01); *H05K 1/028* (2013.01); *H05K 1/0296* (2013.01); *H05K 2201/09045* (2013.01); *H05K 2201/09227* (2013.01)

(58) Field of Classification Search
    CPC . H01L 23/538; H01L 23/5386; H01L 23/528; H01L 23/5387; H05K 1/02; H05K 1/028

USPC ........................................................ 174/254
See application file for complete search history.

(56) References Cited

U.S. PATENT DOCUMENTS

| | | | |
|---|---|---|---|
| 2014/0254111 | A1 | 9/2014 | Yamazaki et al. |
| 2015/0282294 | A1 | 10/2015 | Wakuda et al. |
| 2015/0282296 | A1 | 10/2015 | Ogura et al. |
| 2017/0181276 | A1 | 6/2017 | Sawada et al. |

(Continued)

FOREIGN PATENT DOCUMENTS

| | | | |
|---|---|---|---|
| JP | 2000-122039 A | | 4/2000 |
| JP | 2014-197181 A | | 10/2014 |
| JP | 2015-198101 A | | 11/2015 |

(Continued)

OTHER PUBLICATIONS

Japanese Office Action issued Jan. 30, 2024, in corresponding JP Application No. 2020-008179, 6 pages.

(Continued)

*Primary Examiner* — Tremesha W Burns
(74) *Attorney, Agent, or Firm* — XSENSUS LLP

(57) ABSTRACT

According to one embodiment, a flexible substrate includes a support plate including a first surface, a line portion including a flexible insulating base located on the first surface and a wiring layer disposed on the insulating base, and a protective member covering the line portion, and the wiring layer includes a first metal layer and a second metal layer stacked on the first metal layer, the second metal layer has a first film thickness in a first area and a second film thickness in a second area, and the second film thickness is greater than the first film thickness.

5 Claims, 7 Drawing Sheets

(56) References Cited

U.S. PATENT DOCUMENTS

2020/0218391 A1     7/2020   Kamiya
2021/0185822 A1*   6/2021   Lee .................. H01L 23/49822

FOREIGN PATENT DOCUMENTS

| JP | 2015-198102 A | 11/2015 |
| JP | 2017-113088 A | 6/2017 |
| JP | 2017-118109 A | 6/2017 |
| WO | 2019/058777 A1 | 3/2019 |

OTHER PUBLICATIONS

International Search Report and Written Opinion mailed on Jan. 19, 2021, received for PCT Application PCT/JP2020/040957, filed on Oct. 30, 2020, 10 pages including English Translation.

* cited by examiner

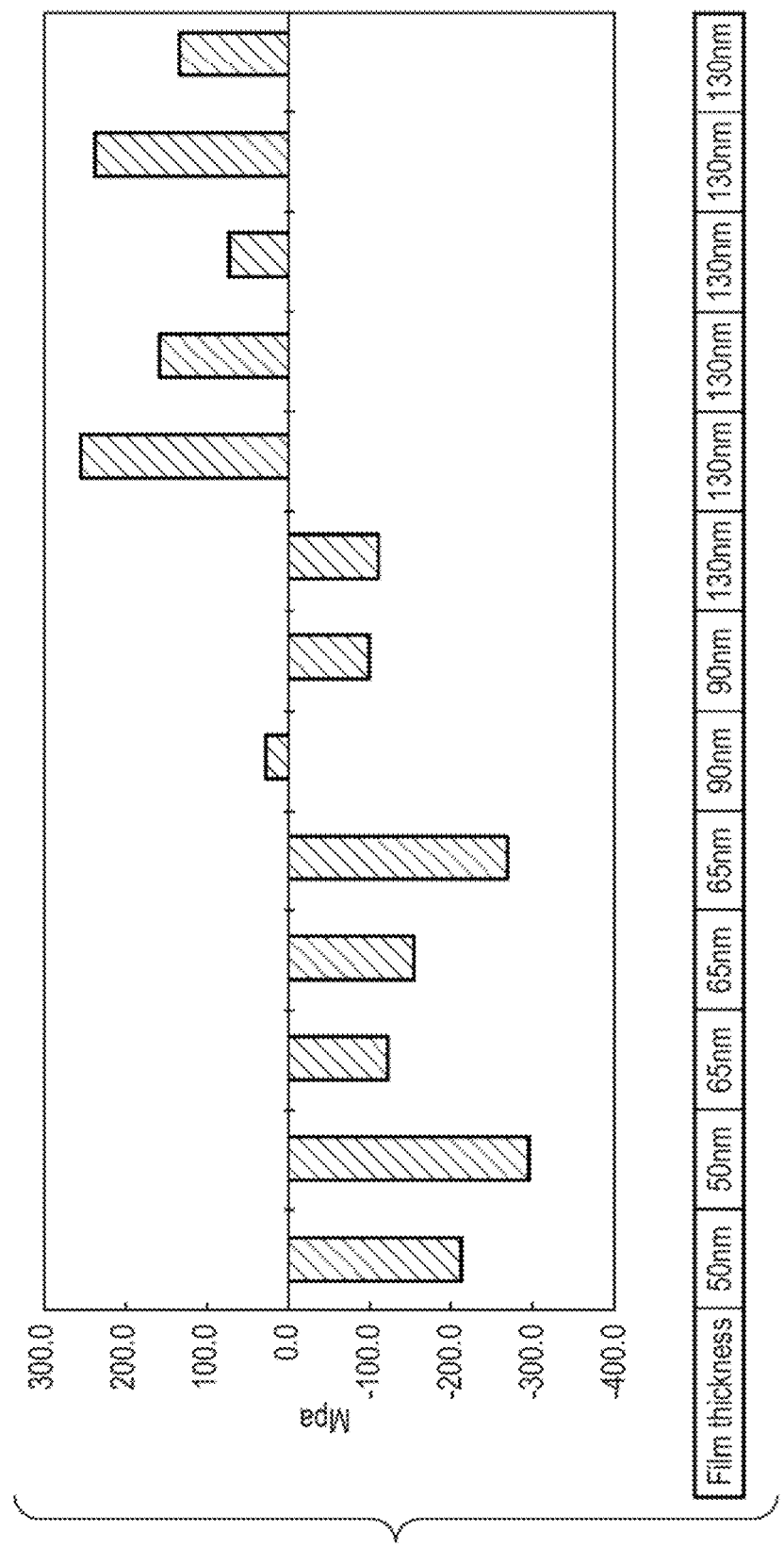
F I G. 7

FLEXIBLE SUBSTRATE

CROSS-REFERENCE TO RELATED APPLICATIONS

This application is a Continuation application of PCT Application No. PCT/JP2020/040957, filed Oct. 30, 2020 and based upon and claiming the benefit of priority from Japanese Patent Application No. 2020-008179, filed Jan. 22, 2020, the entire contents of all of which are incorporated herein by reference.

FIELD

Embodiments described herein relate generally to a flexible substrate.

BACKGROUND

In recent years, the use of flexible substrates with flexibility and elasticity has been studied in various fields. For example, such use can be considered that a flexible substrate with electrical elements arrayed in a matrix shape is attached to a curved surface such as of the housing of an electronic device, human body or the like. As electrical elements, various sensors such as touch sensors and temperature sensors, display elements and the like can be applied.

BRIEF DESCRIPTION OF THE DRAWINGS

FIG. 7 is a graph showing the relationship between the thickness of a layer formed of titanium and stress thereof.

DETAILED DESCRIPTION

Figure 1:
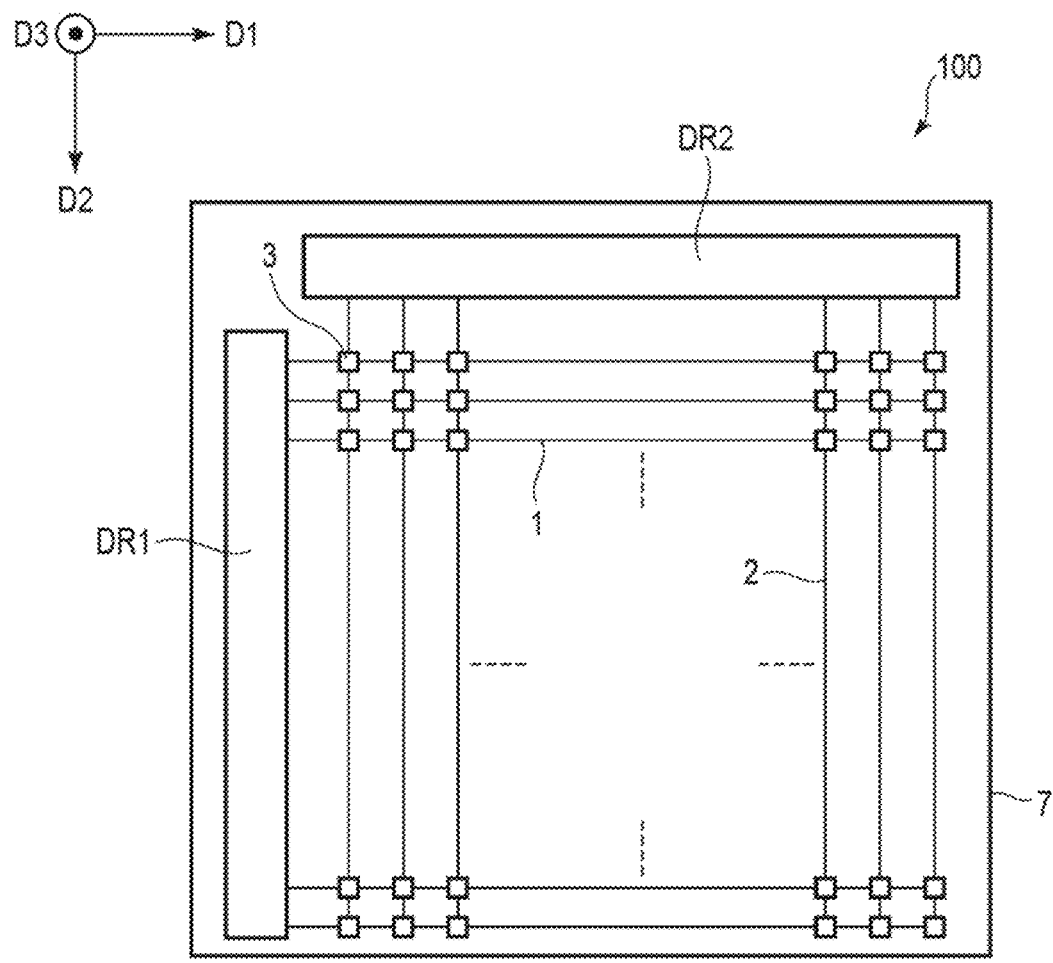
FIG. 1 is a plan view schematically showing a flexible substrate according to an embodiment.

In general, according to one embodiment, a flexible substrate comprises a support plate including a first surface, a line portion including a flexible insulating base located on the first surface and a wiring layer disposed on the insulating base, and a protective member covering the line portion, and the wiring layer includes a first metal layer and a second metal layer stacked on the first metal layer, the second metal layer has a first film thickness in a first area and a second film thickness in a second area, and the second film thickness is greater than the first film thickness.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

FIG. 1 is a plan view schematically showing a flexible substrate 100 according to the embodiment.

In this embodiment, a first direction D1, a second direction D2 and a third direction D3 are defined as shown in the figure. The first direction D1 and the second direction D2 are parallel to a main surface of the flexible substrate 10 and intersect each other. The third direction D3 is perpendicular to the first direction D1 and the second direction D2, and equivalent to the thickness direction of the flexible substrate 100. The first direction D1 and the second direction D2 intersect normal to each other in this embodiment, but they may intersect at an angle other than normal. In this specification, the direction toward the tip of the arrow indicating the third direction D3 is referred to as "upwards" and the direction from the tip of the arrow to the opposite direction is referred to as "downward". Further, it is assumed that there is an observation position for observing the flexible substrate 100 on the tip side of the arrow indicating the third direction D3, and viewing from this observation position toward a D1-D2 plane defined by the first direction D1 and the second direction D2 is called a planar view.

The flexible substrate 100 includes a plurality of scanning lines 1, a plurality of signal lines 2, a plurality of electrical elements 3, a support plate 7, a scanning line driver DR1 and a signal line driver DR2. The scanning lines 1, the signal lines 2, the electrical elements 3, the scanning line driver DR1 and the signal line driver DR2 are located on the support plate 7. The scanning lines 1 each extend along the first direction D1 and aligned along the second direction D2. The scanning lines 1 are each connected to the scanning line driver DR1. The signal lines 2 each extend along the second direction D2 and aligned along the first direction D1. The signal lines 2 are each connected to the signal line driver DR2. The electrical elements 3 are each located at an intersection between each scanning line 1 and each respective signal line 2 and are electrically connected to the scanning lines 1 and the signal lines 2, respectively. Details of the functions of the electrical elements 3 will be described below.

Figure 2:
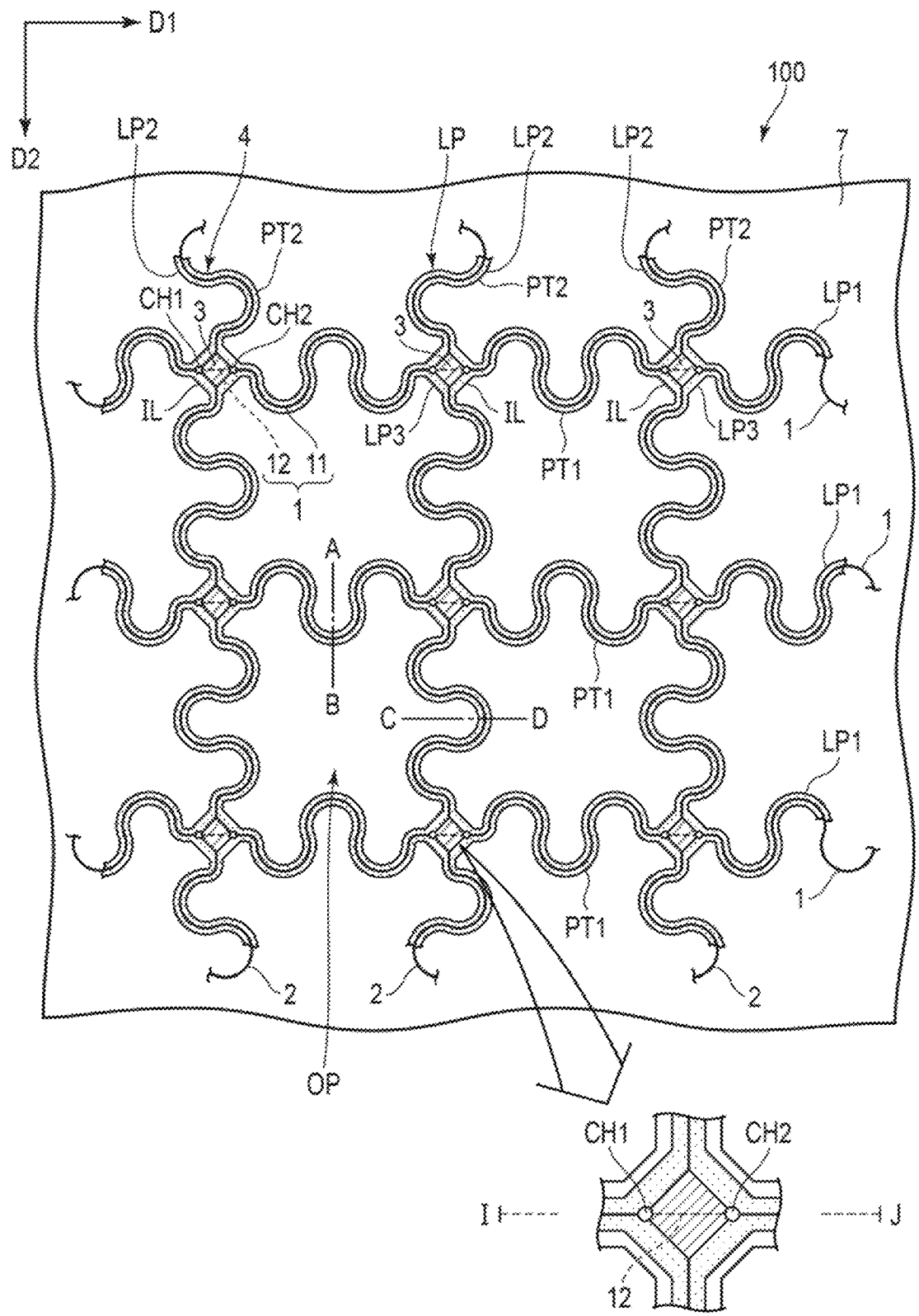
FIG. 2 is a partially enlarged plan view of a flexible substrate shown in FIG. 1.

FIG. 2 is a partially enlarged plan view of the flexible substrate 100 shown in FIG. 1.

The flexible substrate 100 comprises, in addition to those listed above, an insulating base 4 which supports the scanning lines 1 and the signal lines 2.

The insulating base 4 includes a plurality of first portions PT1 each extending along the first direction D1 and aligned along the second direction D2, a plurality of second portions PT2 each extending along the second direction D2 and aligned along the first direction D1, and island-shaped portions IL provided at respective intersections between the first portions PT1 and the second portions PT2, in plan view. The first portion PT1 and the second portion PT2 are each formed into a wavy shape. The island-shaped portions IL are each connected to the respective first portion PT1 and the respective second portion PT2. The insulating base 4 is flexible and can be formed of polyimide, for example, but it is not limited to this example.

The scanning lines 1 are located on the first portions PT1, respectively and are arranged in a wavy pattern. The signal lines 2 are located on the second portions PT2, respectively and are arranged in a wavy pattern. The scanning lines 1 and the signal lines 2 are examples of wiring lines provided on the flexible substrate 100. The scanning lines 1 and the signal lines 2 are formed of a metal material and have a multi-layer structure. The flexible substrate 100 may comprise, in addition to the scanning lines 1 and the signal lines 2, other types of wiring lines including power lines which supply power to the electrical elements 3.

The scanning lines 1 each includes a first portion 11 indicated by solid line and a second portion 12 indicated by dotted line. The second portions 12 each overlap the electrical elements 3, respectively. The first portion 11 and the second portion 12 are located respectively in layers different from each other and are electrically connected to each other via contact holes CH1 and CH2.

The scanning lines 1 each supply a scanning signal to the respective electrical element 3. When, for example, the electrical element 3 is a sensor-type member, which outputs a signal output, an output signal from the respective electrical element 3 is supplied to the respective signal line 2. Further, when, for example, the electrical element 3 is of a type such as a light-emitting element or an actuator, which is actuated in response to an input signal, a drive signal is supplied to the signal line 2. A controller, which may include a supply source of scanning signals, a supply source of drive signals, a processor which processes output signals or the like, may be provided on the flexible substrate 100, or it may be provided on a device connected to flexible substrate 100.

The electrical elements 3 are each located on the respective island-shaped portion IL. The electrical element 3 is smaller than the island-shaped portion IL, and in FIG. 2, the island-shaped portion IL expands out from an edge of the entire electrical element 3. For example, the electrical elements 3 are each a sensor, a semiconductor device, an actuator or the like. For example, as a sensor, an optical sensor which receives visible light or near-infrared light, a temperature sensor, a pressure sensor, a touch sensor or the like can be applied. For example, as a semiconductor element, a light-emitting element, a light-receiving element, a diode a transistor or the like can be applied. When the electrical elements 3 are light-emitting elements, a flexible display having flexibility and elasticity can be realized. As the light-emitting elements, for example, light-emitting diodes such as mini-LEDs or micro-LEDs or organic electroluminescent elements, having a size of around 100 μm can be applied. When the electrical elements 3 are actuators, for example, piezoelectric elements can be applied. Note that the electrical elements 3 are not limited to those listed as examples here, but other elements having various functions can as well be applied. The electrical elements 3 may be capacitors, resistors or the like. The arrangement positions and shape of the electrical elements 3 are not limited to those of the example illustrated in FIG. 2.

In this embodiment, the insulating base 4, the scanning lines 1, the signal lines 2, a first organic insulating film 5 and a second organic insulating film 6 are collectively referred to as line portions LP. The line portions LP are located on the support plate 7. The line portions LP include a plurality of wavy first line portions LP1 extending along the first direction D1 and arranged along the second direction D2, a plurality of wavy second line portions LP2 extending along the second direction D2 and arranged along the first direction D1 and island-shaped portions LP3 provided in respective intersections between the first line portions LP1 and the second line portions LP2. The first line portions LP1 each include the respective first portion PT1 and the respective scanning line 1 of the insulating base 4. The second line portions LP2 each include the respective second portion PT2 and the respective signal line 2 of the insulating base 4. Further, the line portions LP form openings OP each surrounded by two adjacent first line portions LP1 and two adjacent second line portions LP2. The openings OP are aligned in a matrix along the first direction D1 and the second direction D2.

Figure 3:
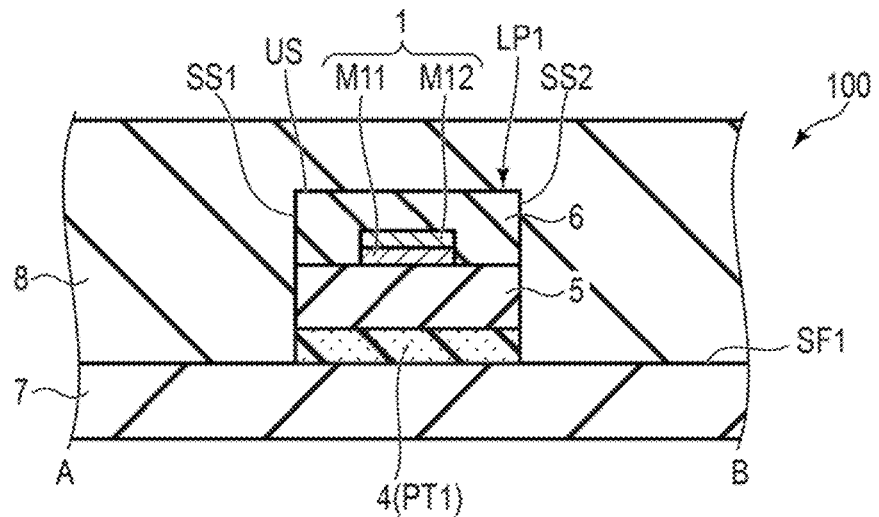
FIG. 3 is a cross-sectional view schematically showing a part of the flexible substrate shown in FIG. 2, taken along line A-B.

FIG. 3 is a cross-sectional view schematically showing a part of the flexible substrate 100 shown in FIG. 2, taken along line A-B.

The flexible substrate 100 includes, in addition to the elements described above, a first organic insulating film 5, a second organic insulating film 6 and a protective member 8.

The support plate 7 includes a first surface SF1. The line portions LP1 are located on the first surface SF1. The line portions LP1 each includes a first side surface SS1, a second side surface SS2 on an opposite side to the first side surface SS1, and an upper surface US. The line portions LP1 are each constituted by the insulating base 4, the first organic insulating film 5, the second organic insulating film 6 and the respective scanning line 1.

The first portions PT1 of the insulating base 4 are located on the first surface SF1. The first organic insulating film 5 covers the insulating base 4. The scanning lines 1 are located on the first organic insulating film 5. The scanning lines (wiring layers) 1 each comprise a first metal layer M11 located above the organic insulating film 15 and a second metal layer M12 stacked on the first metal layer M11. The first metal layer M11 is formed of aluminum, and the second metal layer M12 is formed of titanium. The second organic insulating film 6 covers the first organic insulating film 5 and the scanning lines 1. Both the first organic insulating film 5 and the second organic insulating film 6 are formed of an organic material.

The protective member 8 covers the first side surface SS1, the second side surface SS2 and the upper surface US of each of the line portions LP1, and is in contact with the first surface SF1 of the support plate 7. In other words, the protective member 8 covers the scanning lines 1, the insulating base 4, the first organic insulating film 5 and the second organic insulating film 6. The protective member 8 is in contact with the insulating base 4, the first organic insulating film 5 and the second organic insulating film 6 of each line portion LP1. The protective member 8 is formed of a poly-para-xylylene (poly-p-xylylene: PPX) structure, for example, Parylene (registered trademark). The support plate 7 may be formed by applying an organic material to lower surfaces of the insulating base 4 and the protective member 8, or it may be formed in the form of film or plate shape and adhered via an adhesive layer.

Figure 4:
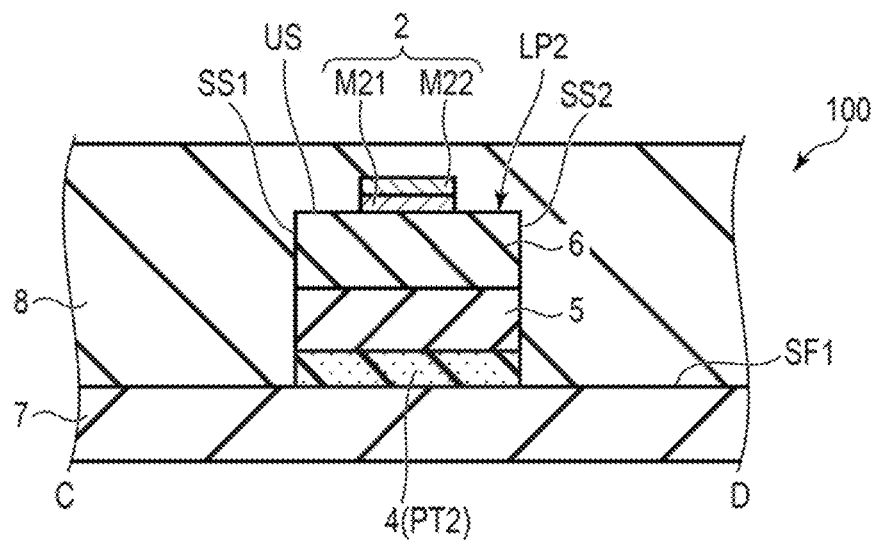
FIG. 4 is a cross-sectional view schematically showing a part of the flexible substrate shown in FIG. 2, taken along line C-D.

FIG. 4 is a cross-sectional view schematically showing a part of the flexible substrate 100 shown in FIG. 2, taken along line C-D.

The line portions LP2 are located on the first surface SF1. The line portions LP2 each include a first side surface SS1, a second side surface SS2 on an opposite side to the first side surface SS1, and an upper surface US. The line portions LP2 are each constituted by the insulating base 4, the first organic insulating film 5, the second organic insulating film 6 and the respective signal line 2.

The second portions PT2 of the insulating base 4 are located on the first surface SF1. The first organic insulating film 5 covers the insulating base 4. The second organic insulating film 6 covers the first organic insulating film 5.

The signal lines 2 are located on the second organic insulating film 6. The signal lines (wiring layers) 2 each comprise a second metal layer M21 located above the second organic insulating film 6 and a second metal layer M22 stacked on the second metal layer M21. The first metal layer M21 is formed of aluminum, and the second metal layer M22 is formed of titanium. The protective member 8 covers the first side surface SS1, the second side surface SS2 and the upper surface US of each line portion LP2, and is in contact with the support plate 7. In other words, the protective member 8 covers the insulating base 4, the first organic insulating film 5, the second organic insulating film 6 and the signal lines 2 and is in contact with each of these.

Figure 5:
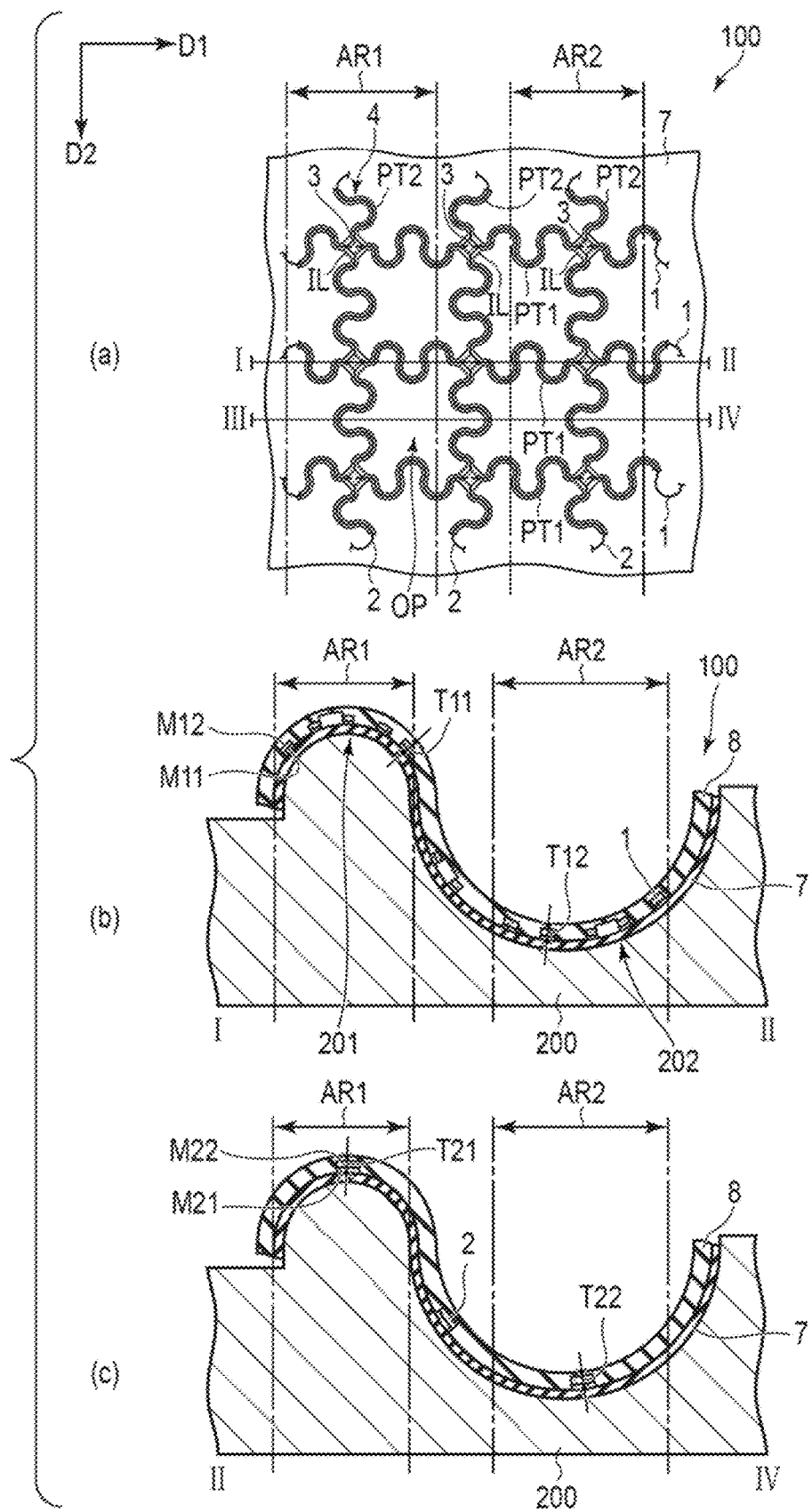
FIG. 5 is a diagram showing a first specific example of this embodiment.

FIG. 5 is a diagram showing a first specific example of this embodiment. FIG. 5, part (a) is a partially enlarged plan view of the flexible substrate 100 of this embodiment. FIG. 5, part (b) is a cross-sectional view of the flexible substrate 100 shown in FIG. 5, part (a), taken along line I-II. FIG. 5, part (c), is a cross-sectional view of the flexible substrate 100 shown in FIG. 5, part (a), taken along line III-IV. FIG. 5, part (b) and part (c), show the support plate 7, the wiring layers and the protective member 8 and the other members are omitted from the illustration.

As shown in FIG. 5, part (a), the flexible substrate 100 includes an expanded first area AR1 and a compressed second area AR2. The first area AR1 and the second area AR2 extend along the second direction D2.

As shown in FIG. 5, part (b), the flexible substrate 100 is attached to a curved surface of a module 200. The module 200 comprises projecting portions 201 and recess portion 202. The first area AR1 is located on the respective projecting portion 201 and is therefore stretched. The second area AR2 is located on the respective recess portion 202 and is therefore compressed. In the scanning lines 1, the thickness of the second metal layer M12 formed of titanium differs between the first area AR1 and the second area AR2. The second metal layer M12 has a first film thickness T11 in the first area AR1 and a second film thickness T12 in the second area AR2. The second film thickness T12 is greater than the first film thickness T11. In the first area AR1, the first film thickness T11 of the second metal layer M12 is less than 90 nm, whereas in the second area AR2, the second film thickness T12 of the second metal layer M12 is greater than 90 nm.

As shown in FIG. 5, part (c), in the signal lines 2 as well, the thickness of the second metal layer M22 formed of titanium differs between the first area AR1 and the second area AR2. The second metal layer M22 has a first film thickness T21 in the first area AR1 and a second film thickness T22 in the second area AR2. The second film thickness T22 is greater than the first film thickness T21. In the first area AR1, the first film thickness T21 of the second metal layer M22 is less than 90 nm, whereas in the second area AR2, the second film thickness T22 of the second metal layer M22 is greater than 90 nm.

According to this embodiment, the second metal layers M12 and M22 formed of titanium have different film thicknesses between in the stretched first area AR1 and the compressed second area AR2. In the first area AR1, where tensile stress is created in the flexible substrate 100, the titanium film is made thin so that compressive stress is generated. In the second area AR2, where compressive stress is created in the flexible substrate 100, the titanium film is made thick so that tensile stress is created. Thus, the tensile and compressive stresses of the flexible substrate 100 can be adjusted by the thickness of the titanium film. By optimizing the thickness of the titanium film in different areas, the stress generated in the wiring lines can be relaxed, thereby suppressing disconnection thereof. In addition, the stress within the plane of the flexible substrate 100 can be made uniform.

Note that the above-provided example is directed to the case where the scanning lines 1 and the signal lines 2 contains the second metal layers M12 and M22 made of titanium, but advantageous effects similar to those described above can be obtained by adjusting the thickness of the titanium film even when other wirings of the flexible substrate 100 contain titanium. In the example shown in the figure, the scanning lines 1 and the signal lines 2 each contain two metal layers, but they may contain three metal layers. In that case, for example, the first metal layer is formed of titanium, the second metal layer is formed of aluminum, and the third metal layer is formed of titanium. By adjusting the thickness of at least one of the first and third layers formed of titanium, similar effects as those described above can be obtained.

Figure 6:
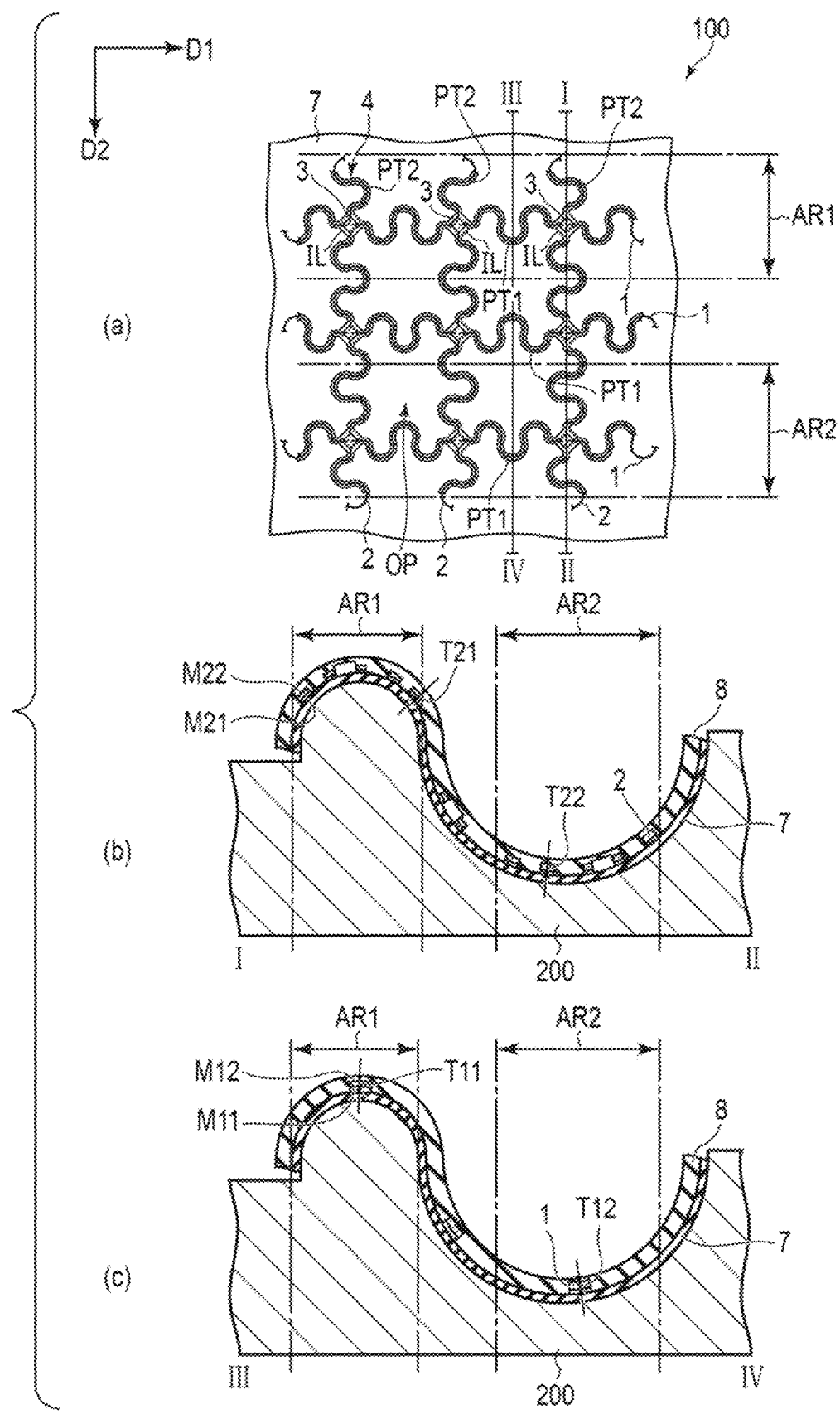
FIG. 6 is a diagram showing a second specific example of this embodiment.

FIG. 6 is a diagram showing a second specific example of this embodiment. FIG. 6, part (a) is a partially enlarged plan view of the flexible substrate 100 of this embodiment. FIG. 6, part (b) is a cross-sectional view of the flexible substrate 100 shown in FIG. 6, part (a), taken along line I-II. FIG. 6, part (c) is a cross-sectional view of the flexible substrate 100 shown in FIG. 6, part (a), taken along line III-IV. In FIG. 6, part (b) and part (c), the support plate 7, the wiring layers and the protective member 8 are shown, and other members are omitted from the illustration. The second specific example shown in FIG. 6 is different from the first specific example of FIG. 5 in that the first area AR 1 and the second area AR2 extend along the first direction D1.

As shown in FIG. 6, part (a), the flexible substrate 100 includes a stretched first area AR1 and a compressed second area AR2. The first area AR1 and the second area AR2 extend along the first direction D1.

As shown in FIG. 6, part (b), the flexible substrate 100 is attached onto a curved surface of a module 200. The module 200 includes projecting portions 201 and recess portions 202. The first area AR1 is located on the respective projecting portion 201 and is therefore stretched. The second area AR2 is located on the recess portion 202 and is therefore compressed. In the signal lines 2, the thickness of the second metal layer M22 formed of titanium differs between the first area AR1 and the second area AR2. The second metal layer M22 has a first film thickness T21 in the first area AR1 and a second film thickness T22 in the second area AR2. The second film thickness T22 is greater than the first film thickness T21. In the first area AR1, the first film thickness T21 of the second metal layer M22 is less than 90 nm, whereas in the second area AR2, the second film thickness T22 of the second metal layer M22 is greater than 90 nm.

As shown in FIG. 6, part (c), in the scanning lines 1, the thickness of the second metal layer M12 formed of titanium differs between the first area AR1 and the second area AR2. The second metal layer M12 has a first film thickness T11 in the first area AR1 and a second film thickness T12 in the second area AR2. The second film thickness T12 is greater than the first film thickness T11. In the first area AR1, the first film thickness T11 of the second metal layer M12 is less than 90 nm, whereas in the second area AR2, the second film thickness T12 of the second metal layer M12 is greater than 90 nm.

In the configuration shown in FIG. 6 as well, advantageous effects similar to those of the configuration shown in FIG. 5 can be obtained.

FIG. 7 is a graph showing the relationship between the film thickness of each of the layers formed of titanium and its stress. FIG. 7 indicates data of the case where the wiring lines are constituted by a first layer formed of aluminum and a second layer formed of titanium.

The vertical axis of the graph shows the stress [MPa] created in the layer formed of titanium. The horizontal axis of the graph shows the thickness [nm] of the layer formed of titanium. From 0 [MPa] above on the vertical axis is tensile stress, and below 0 [MPa] is compressive stress. When the thickness of the titanium film is less than 90 nm, a compressive stress below 0 [MPa] is easily created in the titanium layer. When the thickness of the titanium film is greater than 90 nm, a tensile stress above 0 [MPa] is easily created in the titanium layer. In other words, it can be read that the tensile stress and the compressive stress switch over at the boundary where the titanium film thickness is 90 nm. From the results provided above, it is desirable that in the area where compressive stress is generated in the flexible substrate 100, a titanium layer thicker than 90 nm should be formed to generate tensile stress, whereas in the area where tensile stress is generated in the flexible substrate 100, a titanium layer thinner than 90 nm be formed to generated compressive stress.

Figure 8:
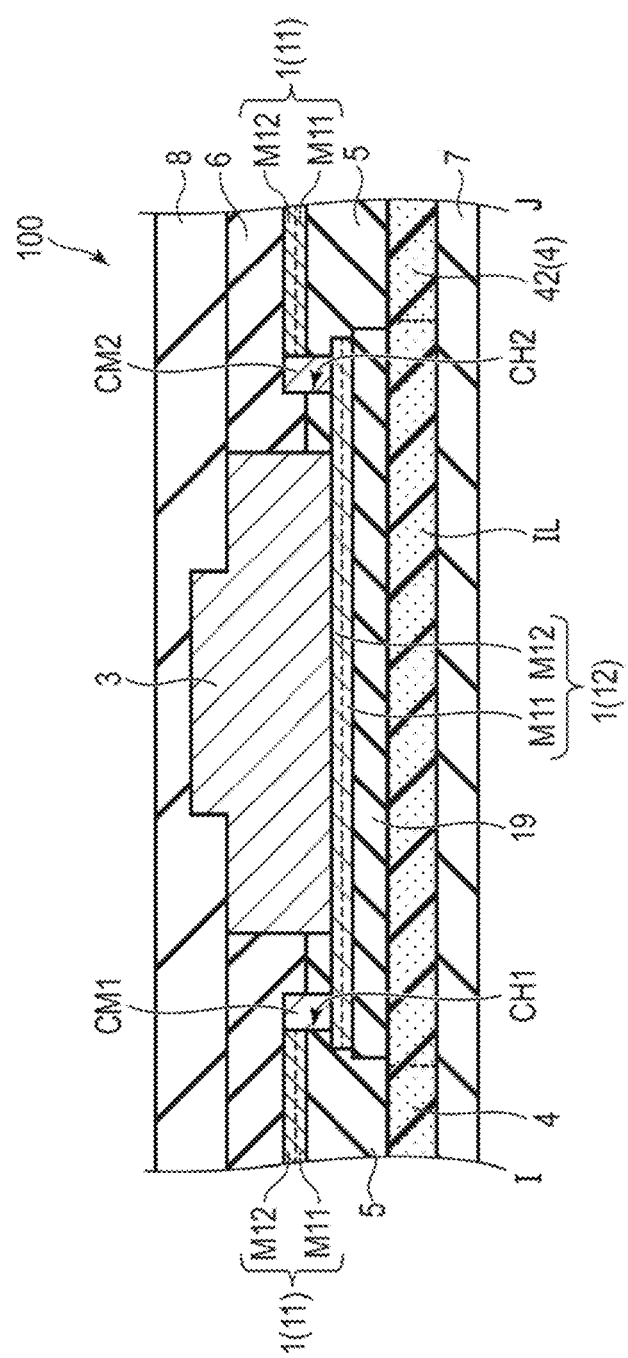
FIG. 8 is a cross-sectional view schematically showing of the flexible substrate shown in FIG. 2, taken along line I-J.

FIG. 8 is a cross-sectional view schematically showing a part of the flexible substrate 100 shown in FIG. 2, taken along line I-J.

The electrical element 3 is placed on the respective island-shaped portion IL of the insulating base 4. Between the electrical element 3 and the island-shaped portion IL, an inorganic insulating layer 19 (a passivation layer) is disposed. The inorganic insulating layer 19 is formed into an island shape which is superimposed on the electrical element 3 (or the island-shaped portion IL) in plan view. The first portion 11 is disposed on the first organic insulating film 5 and covered by the second organic insulating film 6. The second portion 12 is disposed on the inorganic insulating layer 19 and is electrically connected to the electrical element 3. The first portion 11 includes a first metal layer M11 and a second metal layer M12. Similarly, the second portion 12 includes a first metal layer M11 and a second metal layer M12. In the example shown in FIG. 8, both end portions of the second portion 12 are covered by the first organic insulating film 5.

The first organic insulating film 5 is provided with contact holes CH1 and CH2. The first portion 11 is electrically connected to the second portion 12 via connection members CM1 and CM2 disposed in the contact holes CH1 and CH2, respectively. The connecting members CM1 and CM2 may be a part of the first portion 11 or may be provided separately from the first portion 11.

As described above, the island-shaped inorganic insulating layer 19 is disposed between the electrical element 3 and the insulating base 4. The inorganic insulating layer 19 functions as a protective film which inhibits the entering of moisture and the like into the electrical element 3 and the second portion 12 of the scanning line 1. With this configuration, the reliability of the flexible substrate 100 is improved. Further, generally, inorganic films are more prone to cracking than organic films, but because the inorganic insulating layer 19 is not provided below the first portion 11 of the scanning line 11, disconnection in the first portion 11 can be suppressed. This is also the case for the signal lines, which are not shown in the figure. Furthermore, compared to the case where the inorganic insulating layer 19 is provided over the entire flexible substrate 100, the elasticity and flexibility of the flexible substrate 100 are not easily degraded.

Moreover, in the scanning lines 1, the second portion 12 superimposed on the electrical element 3 is located in a layer different from that of the first portion 11, and therefore the degree of freedom of design in the vicinity of the electrical element 3 is improved. Further, since the contact holes CH1 and CH2 are provided above the inorganic insulating layer 19, connection errors at the connection position between the first portion 11 and the second portion 12 can be suppressed.

The island-shaped portion IL of the insulating base 4 is located below the electrical element 3. With this configuration, the electrical element 3 can be well supported. Further, the insulating base 4 is supported by the support plate 7. Therefore, the overall strength of the flexible substrate 100 is increased and the entering of moisture and the like from below can be suppressed.

As described above, according to this embodiment, it is possible to obtain a flexible substrate which can relax stress.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A flexible substrate comprising:
a support plate including a first surface;
a line portion comprising a flexible insulating base located on the first surface, and a wiring layer disposed on the insulating base; and
a protective member covering the line portion, wherein
the wiring layer comprises a first metal layer and a second metal layer stacked on the first metal layer,
the second metal layer has a first film thickness in a first area and a second film thickness in a second area,
the first area is convex,
the second area is concave, and
the second film thickness is greater than the first film thickness.

2. The flexible substrate of claim 1, wherein
the first metal layer is formed of aluminum, and
the second metal layer is formed of titanium.

3. The flexible substrate of claim 1, wherein
in the first area, the first film thickness of the second metal layer is less than 90 nm, and
in the second area, the second film thickness of the second metal layer is greater than 90 nm.

4. The flexible substrate of claim 1, wherein
the insulating base includes, in plan view, a plurality of wavy-shaped first portions extending along a first direction and aligned along a second direction intersecting the first direction, a plurality of wavy-shaped second portions extending along the second direction and aligned along the first direction, and island-shaped portions provided at respective intersections of the first portions and the second portions.

5. The flexible substrate of claim 1, wherein
the first area is stretched and the second area is compressed.

* * * * *